United States Patent
Marek

(10) Patent No.: US 6,441,617 B2
(45) Date of Patent: Aug. 27, 2002

(54) COOLED NMR PROBE HEAD WITH THERMAL INSULATION OF THE SAMPLE

(75) Inventor: Daniel Marek, Moeriken (CH)

(73) Assignee: Bruker BioSpin AG, Faellanden (CH)

( * ) Notice: Subject to any disclaimer, the term of this patent is extended or adjusted under 35 U.S.C. 154(b) by 0 days.

(21) Appl. No.: 09/765,279

(22) Filed: Jan. 22, 2001

(30) Foreign Application Priority Data

Feb. 12, 2000 (DE) .......................................... 100 06 317

(51) Int. Cl.[7] .................................................. G01V 3/00
(52) U.S. Cl. ........................ 324/318; 324/321; 324/300
(58) Field of Search ................................ 324/321, 315, 324/314, 309, 307, 322, 300, 318, 248; 505/845

(56) References Cited

U.S. PATENT DOCUMENTS

| | | | |
|---|---|---|---|
| 5,247,256 A | | 9/1993 | Marek .......................... 324/321 |
| 5,508,613 A | | 4/1996 | Kotsubo ....................... 324/321 |
| 5,689,187 A | * | 11/1997 | Marek .......................... 324/318 |
| 5,814,992 A | * | 9/1998 | Grawitz ....................... 324/318 |

OTHER PUBLICATIONS

R.D. Black et al., "A High Temperature . . . ", Science vol. 259, Feb. 1993, P 793 ff.

* cited by examiner

Primary Examiner—Edward Lefkowitz
Assistant Examiner—Brij B. Shrivastav
(74) Attorney, Agent, or Firm—Paul Vincent

(57) ABSTRACT

An NMR (=nuclear magnetic resonance) probe head comprising an RF (=radio frequency) receiver coil system, which can be cooled down to cryogenic temperatures, and a room temperature pipe (4), extending in a z direction, for receiving a sample tube (6) containing sample substance (7) to be examined by NMR measurements is characterized in that at least one, preferably several radiation shields (9) extending in the z direction and surrounding the room temperature pipe (4) in a radial direction are disposed between the RF receiver coil system (1) and the room temperature pipe (4) which are formed of one or several materials oriented in the z direction and are almost completely transparent to RF fields, at least have an absorption of <5%, preferably <1% for RF fields to thereby provide simple and substantial reduction in the temperature gradient in the z direction during operation without thereby impairing the NMR measurement.

51 Claims, 7 Drawing Sheets

COOLED NMR PROBE HEAD WITH THERMAL INSULATION OF THE SAMPLE

This application claims Paris Convention priority of DE 100 06 317.9 filed Feb. 12, 2000 the complete disclosure of which is hereby incorporated by reference.

BACKGROUND OF THE INVENTION

The invention concerns an NMR (=nuclear magnetic resonance) probe head comprising an RF (=radio frequency) receiver coil system, which can be cooled down to cryogenic temperatures, and a room temperature pipe extending in a z direction for receiving a sample tube containing a sample substance to be examined through NMR measurements.

A cooled NMR probe head of this type is e.g. known from U.S. Pat. No. 5,247,256.

The probe head is installed in a magnet, for generating a highly homogeneous static $B_0$ field, and comprises RF receiver coils disposed about a z axis which are cooled down during operation to temperatures of approximately 10 to 25 K by means of suitable heat exchangers and heat conducting elements to improve the signal-to-noise-ratio of the received NMR signal during the measurement. The RF receiver coils are in an evacuated region for heat insulation reasons which is formed essentially by a normally metallic casing of the probe head which is penetrated by a room temperature pipe disposed cylindrically about the z axis for receiving a sample tube. To permit passage of the RF signals from the sample to the RF receiver coils, the otherwise metallic room temperature pipe is replaced in the axial region of the coils by an RF permeable inner pipe, in most cases a glass pipe, which is connected to the metallic parts of the room temperature pipe in a vacuum-tight fashion.

After insertion of the sample tube into the room temperature pipe from the bottom, it is substantially maintained at a desired temperature (usually approximately 300K) using warm air flowing from below through the room temperature pipe to control the temperature of the sample substance. This, however, causes the associated problem that the measuring sample "feels" the considerably cooler surroundings of the NMR resonator, cooled down to 10 to 25 K, and radially radiates heat in this direction. This lost heat must be continuously replenished by the surging warm tempering air flow to ensure that the measuring sample remains essentially at the desired temperature. In consequence, an axial and radial temperature gradient is produced in the measuring sample which strongly impairs the NMR measurement.

SUMMARY OF THE INVENTION

It is therefore the underlying purpose of the present invention to provide a cooled NMR probe head comprising the above-mentioned features wherein the temperature gradient in the z direction occurring during operation is considerably reduced without thereby impairing the NMR measurement. This object is achieved in accordance with the present invention in a both surprisingly simple and effective manner by providing at least one radiation shield between the RF receiver coil system and the room temperature pipe which radially surrounds the room temperature pipe and extends in the z direction and is composed of one or more materials oriented in the z direction which are almost completely transparent to RF fields, at least however have an absorption of <5%, preferably <1% for RF fields.

In addition to exchangeable sample tubes, the NMR probe heads in accordance with the invention also include so-called flow-through heads wherein the sample tube remains fixedly installed and the fluid to be examined is introduced through a thin conduit on the one side (bottom) and is guided out on the other side (top). Probe heads of this type may be used in continuous passage and also in a flow and stop mode (for an extended measuring period). These probe heads are used for rapid introduction of the sample as well as for an important analysis step following a liquid chromatography separating cell. The former are called flow-through probe heads, the latter LC-NMR coupling. Probe heads of this type are also referred to as LC heads (liquid chromatography, in particular also HPLC High Pressure Liquid Chromatography). Probe heads of this type can particularly profit from cryotechnology and also from the modifications in accordance with the invention. Although cryotechnology has used radiation shields for some time to curtail heat radiation losses, this procedure is not directly applicable for a cooled NMR probe head since the normally metallic radiation shields, which reflect heat radiation, either completely block or at least strongly impair propagation of RF fields from the measuring sample to the RF receiver coils such that the incoming NMR signals are at least highly attenuated, distorted or completely unusable.

In accordance with the inventive solution, the radiation shields provided in the vacuum between the RF coils and the room temperature pipe solely comprise materials which are oriented in the z direction. The axial orientation of the radiation shield material prevents their finite susceptibility from impairing the resolution of the NMR signals. On the other hand, the physical properties of the materials should be such as to effect as large a transparency as possible in the region of radio frequency radiation. In most cases, this material property has the associated disadvantage that reflection of lost heat back towards the measuring sample is not very high.

One embodiment of the inventive NMR probe head is particularly preferred, wherein N radiation shields are disposed in radial sequence between the RF receiver coil system and the room temperature pipe, wherein $N \geq 2$, preferably $5 \leq N \leq 25$. The inventive plurality of radiation shields disposed one radially behind the other, allows formation of a substantial radiation barrier to considerably reduce heat loss from the measuring sample, even for materials which have no thermal radiation reflexivity at all (i.e. are "black") as shown below in detail. Since the space available in the vacuum between the RF receiver coil system and the vacuum side of the room temperature pipe is quite limited, in practice, the number N of radiation shields which can be used in radial sequence is limited.

It is advantageous if the N radiation shields have at least a minimum separation from one another in the radial direction and do not contact each other or at the most contact at points or linearly to prevent direct heat conduction between the individual radiation shields in a radial direction which would lead to a thermal "short circuiting". Occasional contact between the radiation shields is not a serious problem, in particular if the chosen material has very low heat conduction. As long as the individual contacting points or lines are sufficiently spaced apart from one another, the overall heat conduction between the radially disposed radiation shields can be essentially neglected for the purposes of the invention.

Since the separation between the RF receiver coil system and the measuring sample should not be increased in order to prevent reduction in the sensitivity of the NMR measurements, the individual radiation shields should be as thin as possible. The radiation shields should therefore have a radial thickness <0.1 mm, preferably <50 µm. One embodiment of the NMR probe head in accordance with the invention is particularly preferred, wherein the radiation shields are constructed from a material which reflects or at least absorbs radiation in a wavelength range of 10 $\mu m \leq \lambda \leq 100$ $\mu m$ and which is transparent to radiation in a wavelength range of $\lambda > 100$ mm. The former wavelength range corresponds to heat radiation at a temperature of between approximately 20K to 300K which corresponds to the temperature difference between the measuring sample and the cooled NMR coils. The latter wavelength range corresponds to radiation of a frequency below 3 GHz, wherein the RF range which is important for NMR measurements is between several MHz and below approximately 1 GHz.

An optimum material which has practically no absorption losses in the considered RF range, and on the other hand is not transparent in the above-mentioned heat radiation range, is e.g. glass or quartz.

The radiation shields of the NMR probe head in accordance with the invention could theoretically be configured as tubes coaxially surrounding the room temperature pipe. However, the thickness of the tube material would normally be too large.

The radiation shields could also be constructed from a unidirectional foil whose production and processing is, however, relatively difficult. Orientation of the foil along the z axis can be realized e.g. through application of mechanical tensile stress.

In contrast thereto, one embodiment is preferred, in which the radiation shields are made from a unidirectional fabric.

Unidirectional fabric of this type, having correspondingly suitable materials, is commercially available.

These fabrics preferably consist of fiber mats, in particular fiber glass mats which are made of fibers having a diameter of less than 10 $\mu m$ and a total thickness of approximately 30 $\mu m$. When using such fiber glass mats, it would be feasible to wind them in several layers in a spiraling fashion about the room temperature pipe on its vacuum side instead of providing a radial sequence of individual cylindrical radiation shields.

In a further particularly preferred embodiment, the radiation shields are formed of rods or fibers, preferably glass fibers and/or quartz fibers oriented in the z direction and radially disposed about the axis of the room temperature pipe. Fibers of this type are available with diameters of between 10 and 50 $\mu m$. Although, glass filaments having a diameter of less than 5 $\mu m$ are also available, these would probably be difficult to work with.

In a preferred further development, the radiation shields are formed of fiber bundles having somewhat higher overall mechanical stability than the individual filaments and are thus easier to work, similar to rods.

In embodiments of the invention, the rods or fibers may be disposed freely in space and be fastened only at their ends.

Alternatively, the rods or fibers may be mounted to a support pipe disposed coaxially with respect to the room temperature pipe, preferably on the side of the room temperature pipe facing the RF receiver coil system.

In a preferred further development the rods or fibers are mounted to the support pipe or room temperature pipe using a glue transparent to RF radiation in order to prevent attenuation of the RF radiation from the measuring sample to the RF receiver coil due to gluing.

One further development is also advantageous, wherein the rods or fibers are densely packed in the peripheral direction about the axis of the room temperature pipe to prevent visible gaps "as viewed" in the radial direction. In this fashion, the rods or fibers each form a radiation shield connected in the peripheral direction.

One embodiment of the NMR probe head in accordance with the invention is particularly preferred in which a centering device is disposed about the axis of the room temperature pipe for centering the sample tube in its measuring position. The transverse temperature gradients, extending radially with respect to the z axis, which can occur during operation of a cooled NMR probe head are given by the product of the heat loss per unit area, the reciprocal value of the mass flow of tempering gas and a symmetry factor which includes a displacement or angular deviation of the sample tube axis from the z axis of the room temperature pipe. Since this asymmetry appears as a factor in the overall product, even slight inclinations of the measuring sample within the room temperature pipe have considerable effects on the tempering flow. It is therefore possible, by means of the proposed centering device, to achieve a noticeable additional reduction in the tempering gradients to improve the quality of the NMR signals.

In a further development which is particularly easy to realize, the centering device comprises one or more spacers disposed between the room temperature pipe and the sample tube and symmetrically distributed about the z axis of the room temperature pipe.

These spacers may be disposed in the area of the bottom of the sample tube in its measuring position and/or in the area of the feed opening of the room temperature pipe on the side of the room temperature pipe facing the sample tube. Alternatively, the spacers may extend over the entire axial length of the RF receiver coil system.

One further development is also advantageous, wherein the spacers consist of strips of elastic material extending in the direction of the z axis which are rigidly connected to the room temperature pipe at their ends facing away from the sample glass in its measuring position and whose ends facing the sample glass in its measuring position have a bead which is bulged towards the sample glass and whose free leg seats on the room temperature pipe.

To prevent disturbance of the NMR measurements, the spacers should be produced from a material which is transparent to RF radiation.

In a preferred further development, the spacers consist of sheet metal strips having a thickness of approximately 100 $\mu m$ and a width transverse to the z axis of approximately 0.5 mm to 2 mm, preferably approximately 1 mm.

In a particularly preferred embodiment of the NMR probe head in accordance with the invention a tempering means is disposed between the RF receiver coil system and the sample tube which surrounds the sample tube in the radial direction and extends in the z direction and is made of a material having good thermal conductivity and being almost completely transparent to RF fields or at least having an absorption of <5%, preferably <1% for RF fields.

This prevents dissipation of heat from the measuring sample and thus uneven cooling, without significantly impairing the received NMR signals. The advantage of such a tempering means compared to a heated air flow about the sample tube is mainly the fact that the thermal efficiency can act uniformly along the entire axial length of the sample tube. The central area is thereby as well tempered as the edge areas, to effectively prevent axial temperature gradients.

In contrast thereto, a conventionally heated air flow, without the heating means in accordance with the invention, usually enters into the room temperature pipe at the lower end of the sample tube, starts to heat up the sample tube at this location and continues to cool down while rising in the axial direction. The temperature of the heated air flow in the upper region of the sample tube will therefore always be less than in the lower area thereby inevitably reducing the tempering efficiency in the upper region of the sample tube. As a result, there will always be an axial temperature gradient which can be somewhat reduced by increasing the amount of air per unit time, however cannot be prevented in principle. Moreover, the corresponding countermeasures are highly limited since, if the amount of air per unit time is too large, vibration free positioning or proper rotation of the sample tube can no longer be guaranteed.

In a possible further development of this embodiment, the tempering means comprises a layer having a radial thickness of <1 mm, preferably <50 $\mu$m, radially surrounding the sample tube in the axial region of the RF receiver coil system and formed of a material which at least partially absorbs radiation in a wavelength range of 100 nm$\leq\lambda\leq$100 $\mu$m and which is transparent to radiation in a wavelength range of $\lambda$>100 mm.

For uniform heating of the layer, the NMR probe head in accordance with the invention is preferably provided with a heating means.

In a preferred further development, the heating means comprises a device for irradiating the layer with radiation in a wavelength range of 100 nm$\leq\lambda\leq$100 $\mu$m, in particular with heat radiation, the device being preferably disposed on the side of the room temperature pipe facing the RF receiver coil system.

Many materials which can be used to construct the room temperature pipe already absorb in the desired wavelength range such that heating up using radiation does not require a special radiation-absorbing layer.

The radiation absorbing heating layer may surround the room temperature pipe over a large area. Alternatively, the layer may be disposed about the room temperature pipe in axially extending strips disposed at a separation from one another in the peripheral direction.

One further development is particularly preferred in which the layer is electrically conducting and can be heated through application of an electric voltage.

Alternatively or additionally, a further embodiment provides that the tempering means comprises one or more heating coils of thin, in particular layered material having good conducting properties, each comprising an outgoing and return conductor.

The outgoing and return conductors of the heating coils are electrically connected to one another at one end and can be supplied with heating current from a current source at the other end.

In a particularly preferred manner, the outgoing and return conductors of the heating coils are disposed bifilarly at as small a separation from one another as possible to minimize generation of a disturbing magnetic field during current flow.

In this connection, it is advantageous if the outgoing and return conductors of the heating coils consist of two longitudinal strips disposed one on top of the other which are electrically insulated from one another by an insulation layer or insulation strip.

A further development is particularly preferred with which the outgoing and return conductors of the heating coils are made from materials having different magnetic susceptibilities and which are selected such that each overall heating coil is magnetically compensated towards the outside.

The tempering means can be geometrically designed such that one or more heating coils are disposed in a spiral fashion about the room temperature pipe.

As an alternative, it is also possible to dispose several, preferably at least 8, heating coils at a separation from one another in the peripheral direction about the z axis of the room temperature pipe, which extend parallel to the z direction.

Advantageously, the spatial orientation of the heating coils is such that they are minimally coupled to the RF receiver coil system.

One embodiment of the heating coils having a material exhibiting as good an electrical conductance as possible (e.g. Cu) is particularly preferred, wherein the conductors have rectangular, possibly square or circular cross-sections (typically of a magnitude of 10 $\mu$m×10 $\mu$m or less). Due to the resulting very small overall surface covering, the room temperature pipe maintains its good permeability to RF fields, and the RF losses are also very low due to both the small surfaces of the heating conductors and the good electrical (and thus RF) conductivity.

In a preferred further development of the above-described embodiment, a low-pass filter may be provided between the current source and the heating coils to minimize signal distortion and residual attenuation.

One further development is also preferred in which a parallel resonant circuit is provided between the current source and the heating coils whose resonance frequency is the most sensitive RF frequency relevant for NMR measurements. Such a rejecter circuit also prevents transmission of disturbing signals to the RF receiver coil system and minimizes unwanted coupling-out of the RF signals via the heating coils.

In a further development, the current source advantageously supplies the heating coils with alternating current in order to keep further disturbances in the static magnetic field as small as possible. The angular frequency is thereby selected such that generated side bands are all outside of the observed NMR spectral window.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 4b shows the temperature distribution in the z direction associated with the arrangement according to FIG. 4a;

FIG. 5b shows the associated temperature dependencies in the direction of the z axis on the left and right-hand side of the arrangement of FIG. 5a;

FIG. 11b shows a horizontal section through an arrangement according to FIG. 11a.

DESCRIPTION OF THE PREFERRED EMBODIMENT

Figure 1:
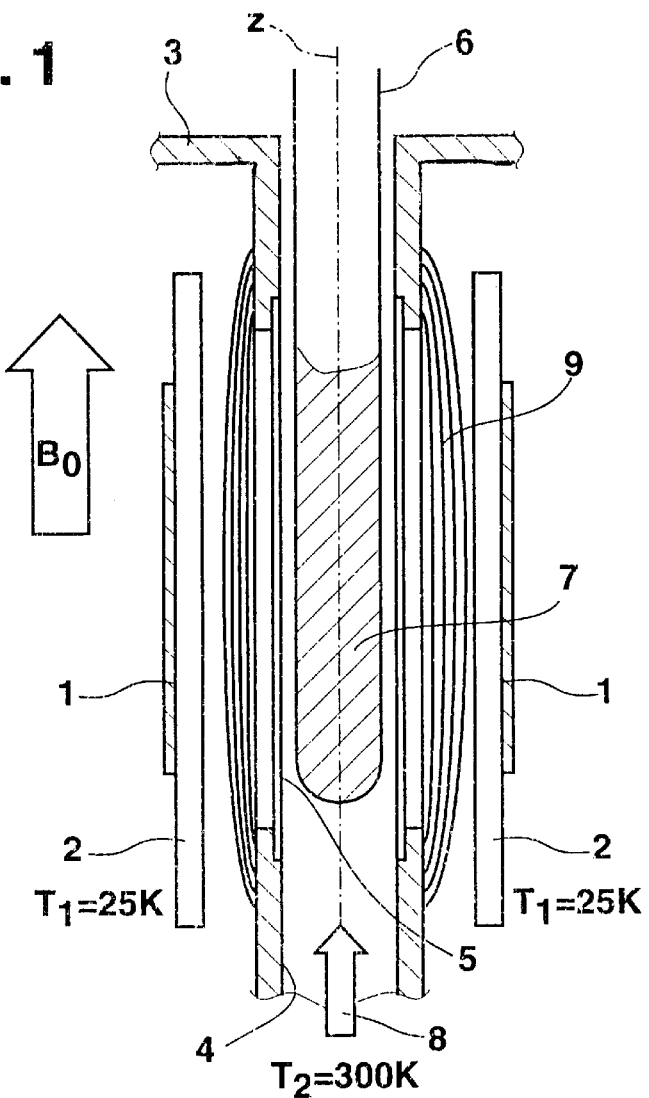
FIG. 1 shows a schematic vertical section along the z axis through an NMR probe head in accordance with the invention in the region of the RF receiver coil system.

The NMR probe head schematically shown in FIG. 1 comprises an RF receiver coil system 1 disposed symmetrically about a z axis about an axially extending room temperature pipe 4 which serves for receiving a sample tube 6 containing a sample substance 7 to be examined through NMR measurements. The RF receiver coil system 1 is mounted to heat conducting elements 2 which serve for cooling the RF receiver coil system 1 to cryogenic temperatures, usually $T_1 \approx 25K$.

The upper and lower sections of the room temperature pipe 4 are connected to a casing 3 of the NMR probe head whereas its central section comprises an inner pipe 5 (mainly of glass) which is permeable to RF fields. The sample tube 6, axially projecting into the room temperature pipe 4, is held at the desired temperature during the measurements by means of a gas flow 8 which is tempered approximately to room temperature $T_2 \approx 300K$.

Figure 2:
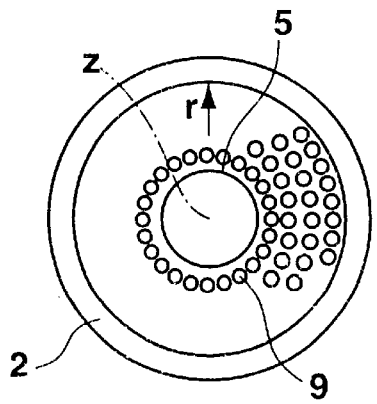
FIG. 2 shows a schematic horizontal section through an NMR probe head in accordance with the invention in the axial region of the RF receiver coil system.

FIGS. 1 and 2 clearly show that several radiation shields 9 are disposed between the receiver coil system 1 and the room temperature pipe 4 surrounding the room temperature pipe 4 in a radial direction and extending along the z axis.

The radiation shields 9 are formed of materials oriented in the z direction which are almost completely transparent to RF fields. The radiation shields 9 are separated from each other in the radial direction and do not contact another or, at the most, have point or linear contacts, as clearly shown in FIG. 2. They have a radial thickness <0.1 mm, preferably <50 µm. The radiation shields 9 are preferably made from glass or quartz.

To obtain orientation of the material in the z direction as required by the invention, the radiation shields 9 may be formed of a unidirectional foil, of unidirectional fabric, in particular of fiber glass mats, or of axially extending rods or fibers, preferably glass or quartz fibers or fiber bundles.

The radiation shields 9 may be freely disposed in space and mounted only at their ends or, as shown in the embodiment, mounted to the room temperature pipe 4.

Figure 3:
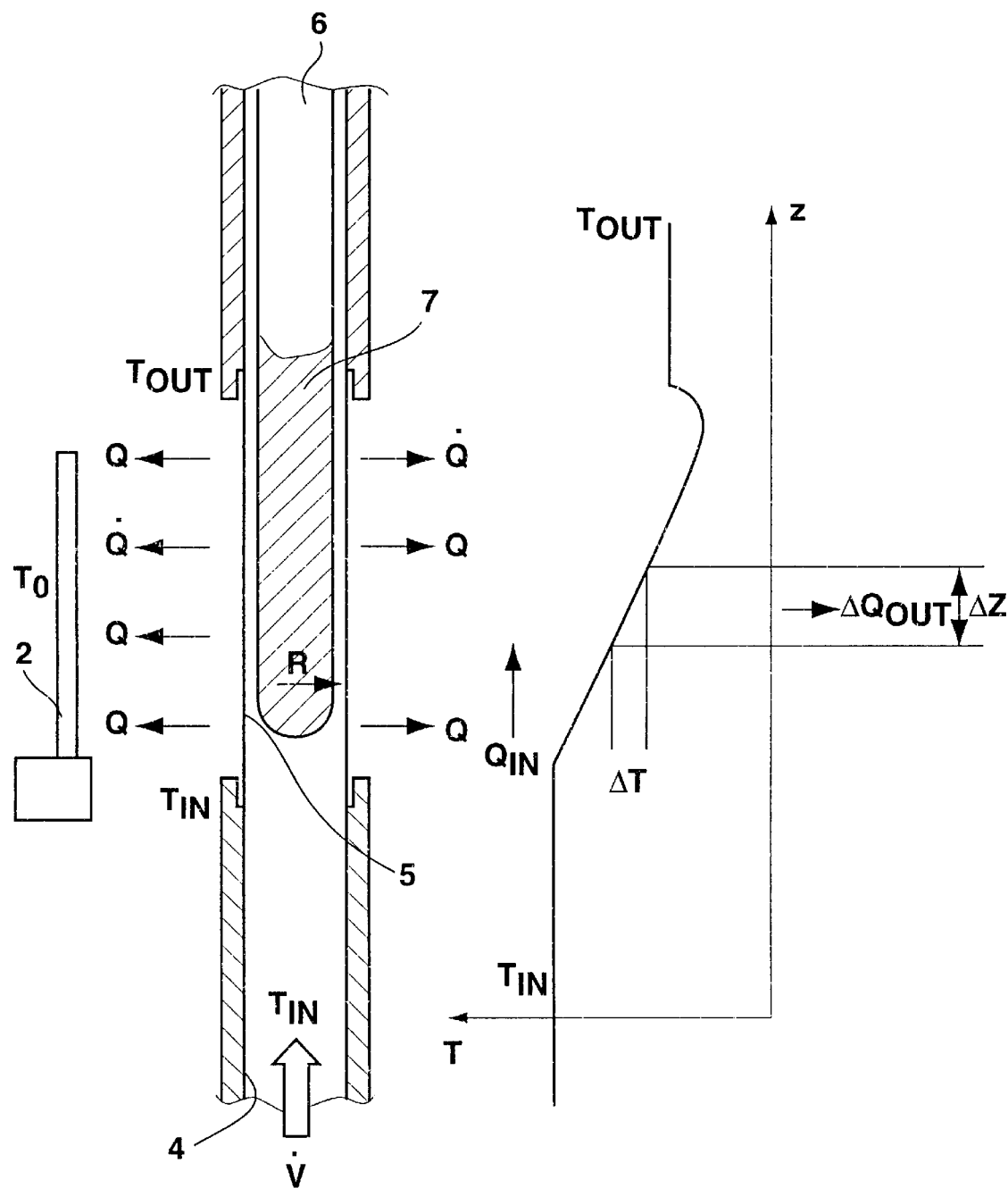
FIG. 3 shows a schematic vertical section through a cooled NMR probe head according to prior art with associated temperature dependence in the direction of the z axis.

The operation of the inventive arrangement is described below:

FIG. 3 schematically shows a section of an NMR probe head of prior art, wherein radiative heat flow Q passes from a sample tube 6 in a radial direction towards the RF receiver coil system 1 since the receiver coil system 1 is maintained at a cryogenic temperature of approximately 25K while the sample tube 6 should be held approximately at room temperature using the tempered air flow 8 supplied from below. The heat radiation from the sample tube 6 results, taking into consideration the heat supplied by the tempering flow 8, in a temperature dependence in an axial direction within the sample tube 6 as schematically shown at the right hand side of FIG. 3.

The relatively high temperature gradients within the sample substance 7 often result in an undesired deterioration of the recorded NMR spectra. The lines widen due to the temperature dependence of the chemical shift which can prevent simultaneous shimming of two substances. This effect is particularly distinct with water.

In addition, convection effects can occur if the temperature gradient has exceeded a critical value. The resulting fluctuations can considerably impair stability during shimming and during NMR experiments.

Figure 4A:
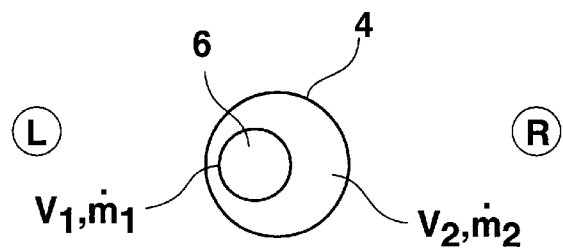
FIG. 4a shows a schematic horizontal section through an arrangement with the sample tube being asymmetrically introduced into the room temperature pipe.
Figure 4B:
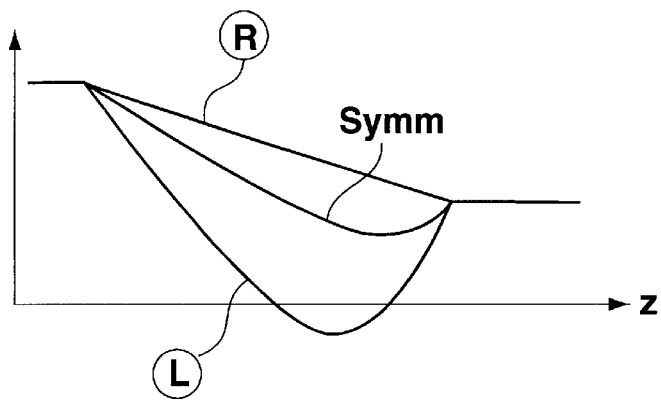

In addition to the temperature gradients in the z direction, transverse gradients can also occur if the sample tube 6 is not positioned exactly in the center of the room temperature pipe 4, as schematically shown in the horizontal section of FIG. 4a.

Due to the differing mass flows resulting from the differing flow resistances on the left (L) and right (R) sides, differing longitudinal gradients occur on either side, leading to a transverse temperature gradient which becomes more distinct towards the top, as shown in FIG. 3b. Of the three temperature dependencies shown, the middle one illustrates the symmetric case.

Figure 5A:
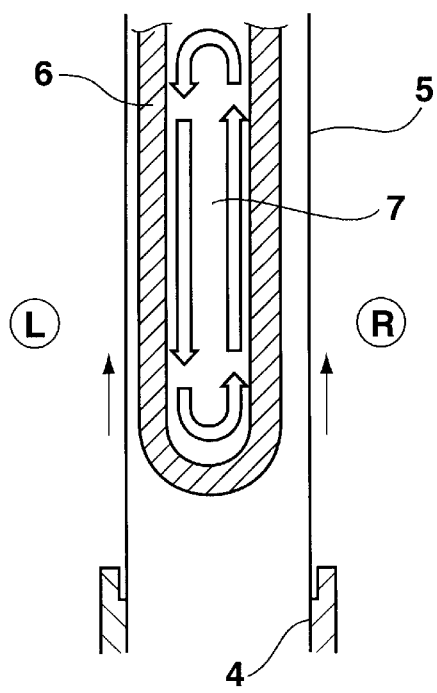
FIG. 5a shows a schematic vertical section through a room temperature pipe with asymmetrically introduced sample tube and indicated convection flows within the measuring sample.
Figure 5B:
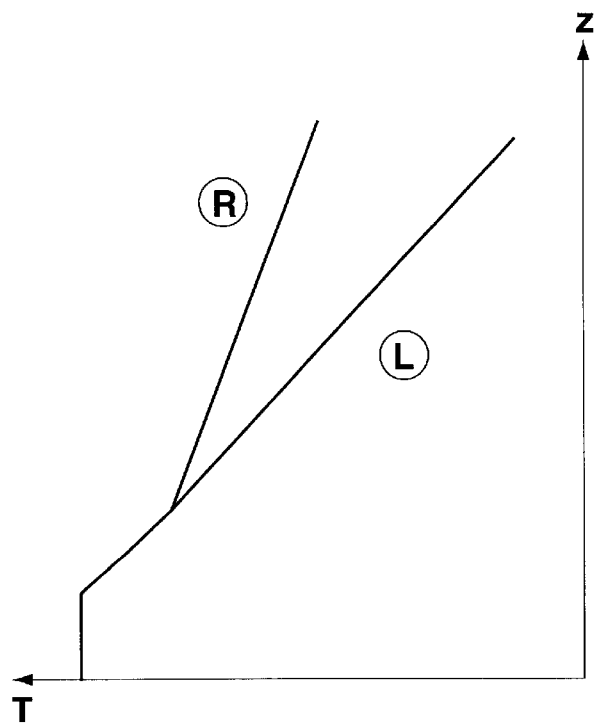

This gradient additionally promotes formation of convection within the normally liquid sample substance 7, as is schematically shown in FIG. 5a. The associated temperature dependencies in the z direction are shown in FIG. 5b. The temperature dependence on the right-hand side (=R) may thereby differ considerably from the temperature dependence on the left-hand side (=L).

To counteract this effect, the central part 5 of the room temperature pipe 4 is made from a material having good heat conduction to thereby considerably reduce the transverse temperature gradients (x–y direction). However, only those materials are acceptable having negligibly small RF radiation absorption while also exhibiting the required high heat conductivity. A concrete example is sapphire.

Figure 6:
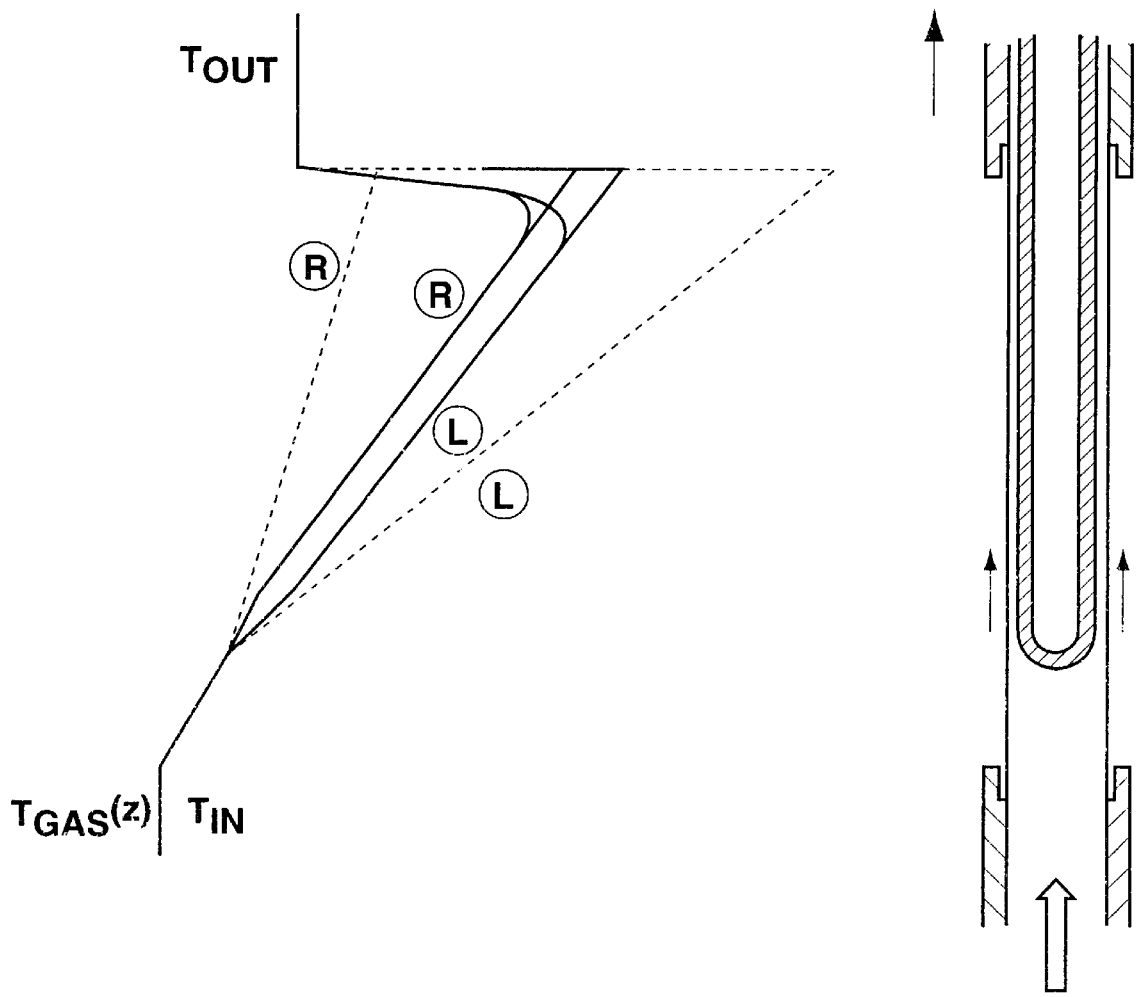
FIG. 6 shows a schematic temperature dependence on the tempering gas in the direction of the z axis with the sample tube being asymmetrically introduced into the room temperature pipe, with the inner side of the room temperature pipe in the region of the RF receiver coils having good heat-conducting properties.

FIG. 6 shows this situation with poor heat conductivity (broken lines) and with good heat conductivity (solid lines) for the room temperature pipe 4, in particular of the inner pipe 5. The temperature dependence along the z axis cannot be substantially influenced thereby (except for averaging of the two extrema).

Figure 7:
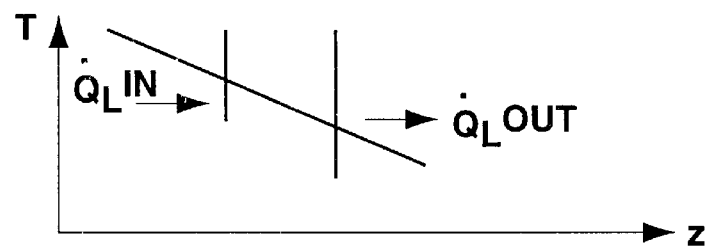
FIG. 7 shows a schematic temperature dependence in the direction of the z axis, with the inner side of the room temperature pipe having good heat-conducting properties.

Only the temperature dependence directly before the upper clamping point of the sample tube 6 can be improved. It is not possible to eliminate a linear temperature gradient merely through heat-conducting measures on the room temperature pipe 4 as shown by the schematic temperature dependence in the direction of the z axis with good head-conducting inner side of the room temperature pipe 4 shown in FIG. 7.

Figure 8A:
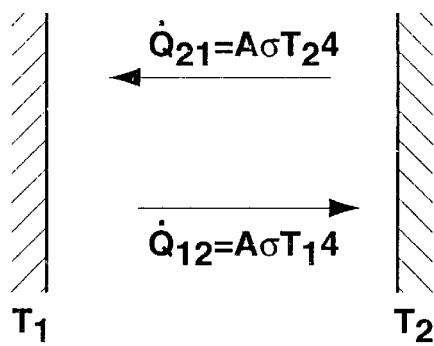
FIG. 8a shows a schematic representation of the heat flows due to radiation between a surface at temperature $T_1$ and a second surface at temperature $T_2$.

To further examine the heat radiation flow between the sample tube 4 and the cooled RF receiver coil system 1, FIG. 8a schematically shows the radiation performance between a surface $F_1$ at temperature $T_1$ and an opposing surface $F_2$ at temperature $T_2$. The radiated power from a surface $F_1$ to the surface $F_2$ is $$Q_{12} = A \times \sigma \times T_1^4 \times \epsilon$$

The radiated power in the opposite direction is $$Q_{21} = A \times \sigma \times T_2^4 \times \epsilon.$$

Wherein A is the size of the radiating surfaces, $\sigma$ is the specific heat flow (approximately $5.77 \times 10^{-8}$ W/m$^2$K$^4$) and $\epsilon$ is the radiation coefficient which may be between 0 and 1. For two completely black bodies which cannot reflect impinging radiation, $\epsilon = 1$.

The net cooling power $Q_2$ at the surface $F_2$ with $\epsilon = 1$ is $$Q_2 = Q_{21} - Q_{12} = A \times \sigma \times (T_2^4 - T_1^4).$$

Figure 8B:
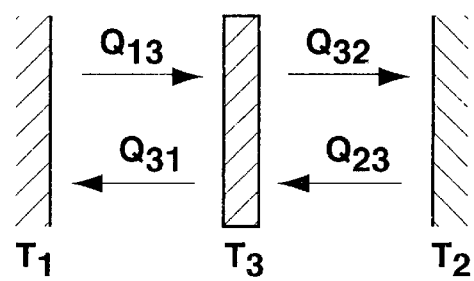
FIG. 8b corresponds to FIG. 8a, however, with one radiation shield at a temperature $T_3$, between the two surfaces.

When introducing a black radiation shield $F_3$ between the two surfaces $F_1$ and $F_2$ which has no direct thermal contact with the two other surfaces $F_1$ and $F_2$, a balancing temperature $T_3$ is generated there due to the radiation fields, as indicated in FIG. 8b.

Figure 9A:
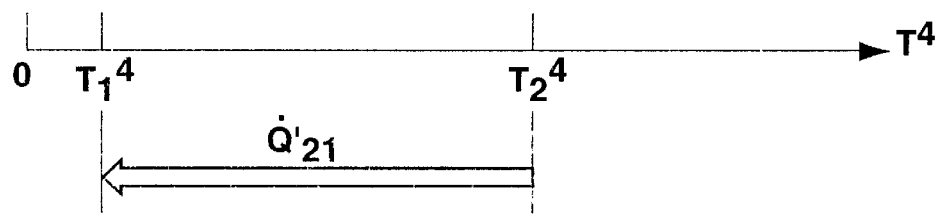
FIG. 9a shows the heat flow between the surfaces according to FIG. 8a on a $T^4$ scale.

If the temperatures of the different surfaces are plotted on a $T^4$ scale, the heat flow between the surfaces is proportional to the difference separations $\Delta(T^4)$. This is shown in FIG. 9a for the case shown in FIG. 8a with merely two surfaces and in FIG. 9b for the case shown in FIG. 8b with one radiation shield between the two surfaces. As balancing condition for the temperature $T_3$ of the radiation shield $F_3$ it is required that the two net heat flows $Q'_{23}$ between the surface $F_2$ and the radiation shield $F_3$, and $Q'_{31}$ between the radiation shield $F_3$ and the surface $F_1$ are equal.

Through interposing the radiation shield $F_3$ between the two surfaces $F_1$ and $F_2$, the temperature difference $\Delta(T_2^4 - T_3^4) = \Delta(T_3^4 - T_1^4)$ was brought to half the value of the temperature difference $\Delta(T_2^4 - T_1^4)$ of FIG. 9a since:

$$Q'_{23} = Q'_{31} = 0.5 \times Q_{21}$$

Figure 9B:
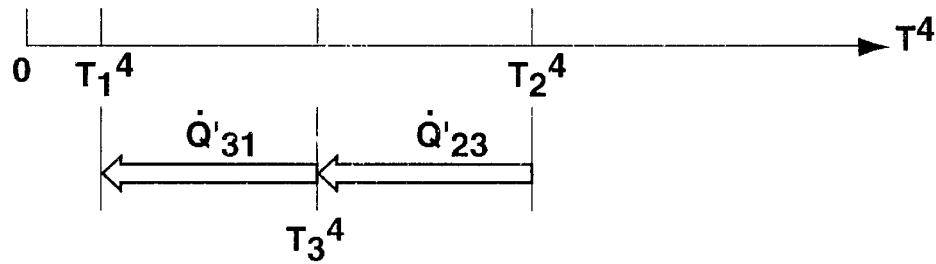
FIG. 9b shows the situation of the arrangement according to FIG. 8b on a $T^4$ scale.
Figure 9C:
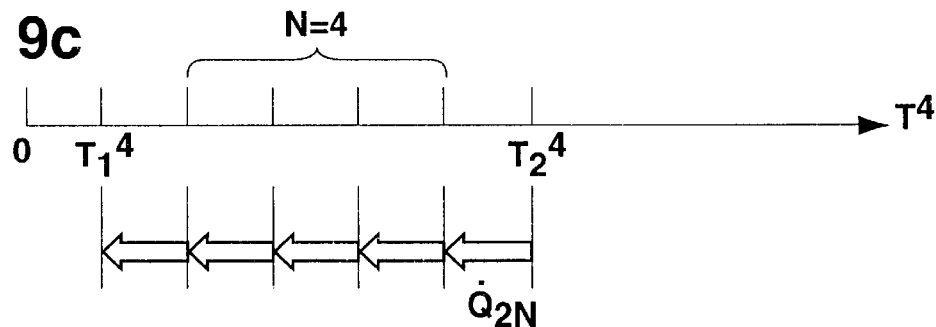
FIG. 9c corresponds to FIG. 9b, however, having four, instead of one, interposed radiation shields.

FIG. 9c shows the situation of FIG. 9b, generalized for N radiation shields which are to be disposed radially with respect to the z axis, one behind the other, in accordance with the invention.

Analogously to the case of FIG. 9b the following generally holds:

$$Q_{2N} = (N+1)^{-1} \times Q_{21}.$$

This means that when N black radiation shields are used, the net radiation power given off by the surface $F_2$ is reduced to $(N+1)^{-1}$.

Use of the inventive radiation shields 9 is conditional upon the basic prerequisite for the application of NMR measurements: namely, that the homogeneity of the static magnetic field $B_0$ must not be impaired. All magnetic objects having varying magnetic properties in the z direction cause potential disturbances of the $B_0$ field.

Figure 10A:
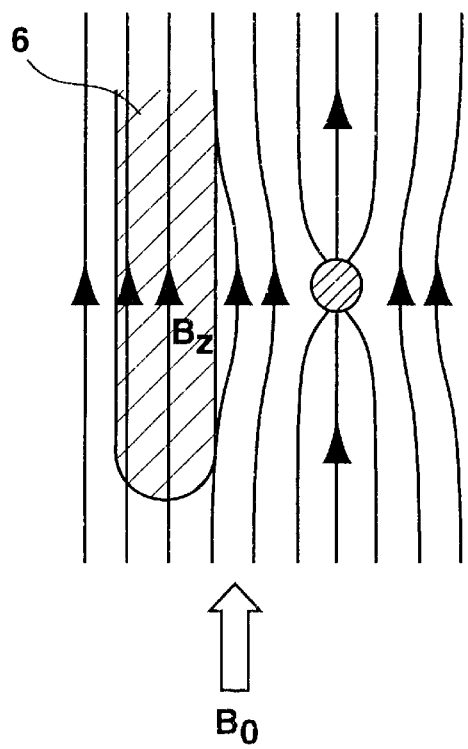
FIG. 10a shows a schematic representation of the magnetic field disturbance caused materials having a magnetic susceptibility >0.

Such a field disturbance, associated with use of materials with magnetic susceptibility $\chi > 0$, is schematically shown in FIG. 10a. The magnetic disturbance causes distortion of the field lines of the homogeneous magnetic field in a certain spatial area.

Figure 10B:
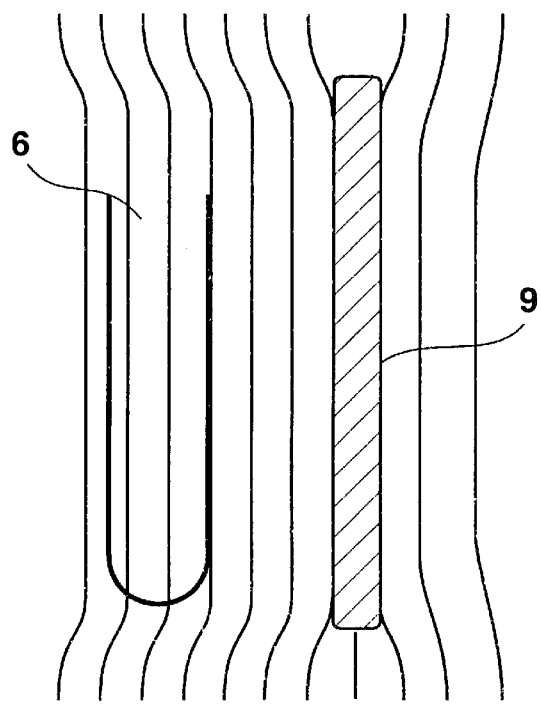
FIG. 10b corresponds to FIG. 10a, however, with an object extended in the z direction along the magnetic field.

FIG. 10b schematically shows the inventive situation, wherein a radiation shield 9 is extended in the z direction along the $B_0$ field thereby causing no field disturbances despite magnetic susceptibility $\chi > 0$ in the decisive area of the measuring sample 7.

Figure 11A:
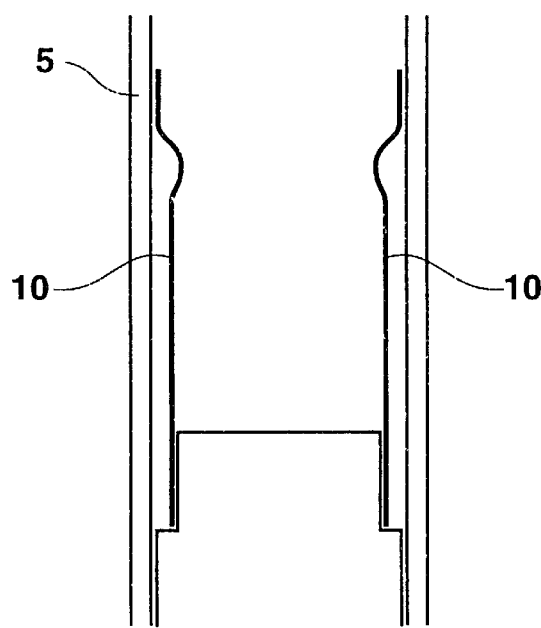
FIG. 11a shows a schematic vertical section through an inventive arrangement comprising a centering means.
Figure 11B:
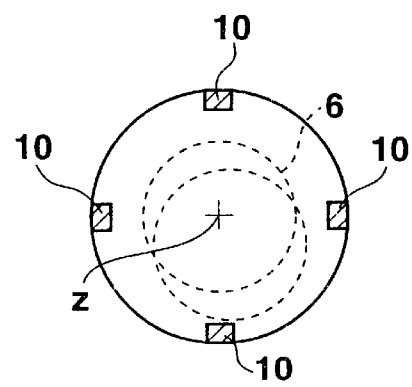

FIGS. 11a and 11b show a preferred embodiment of the inventive NMR probe head comprising a centering device having in the embodiment shown, four spacers 10 symmetrically disposed about the z axis. The effected proper centering of the sample tube 6 within the room temperature pipe 4 prevents convection flows and thus formation of temperature gradients within the sample substance 7, as described above.

Figure 12:
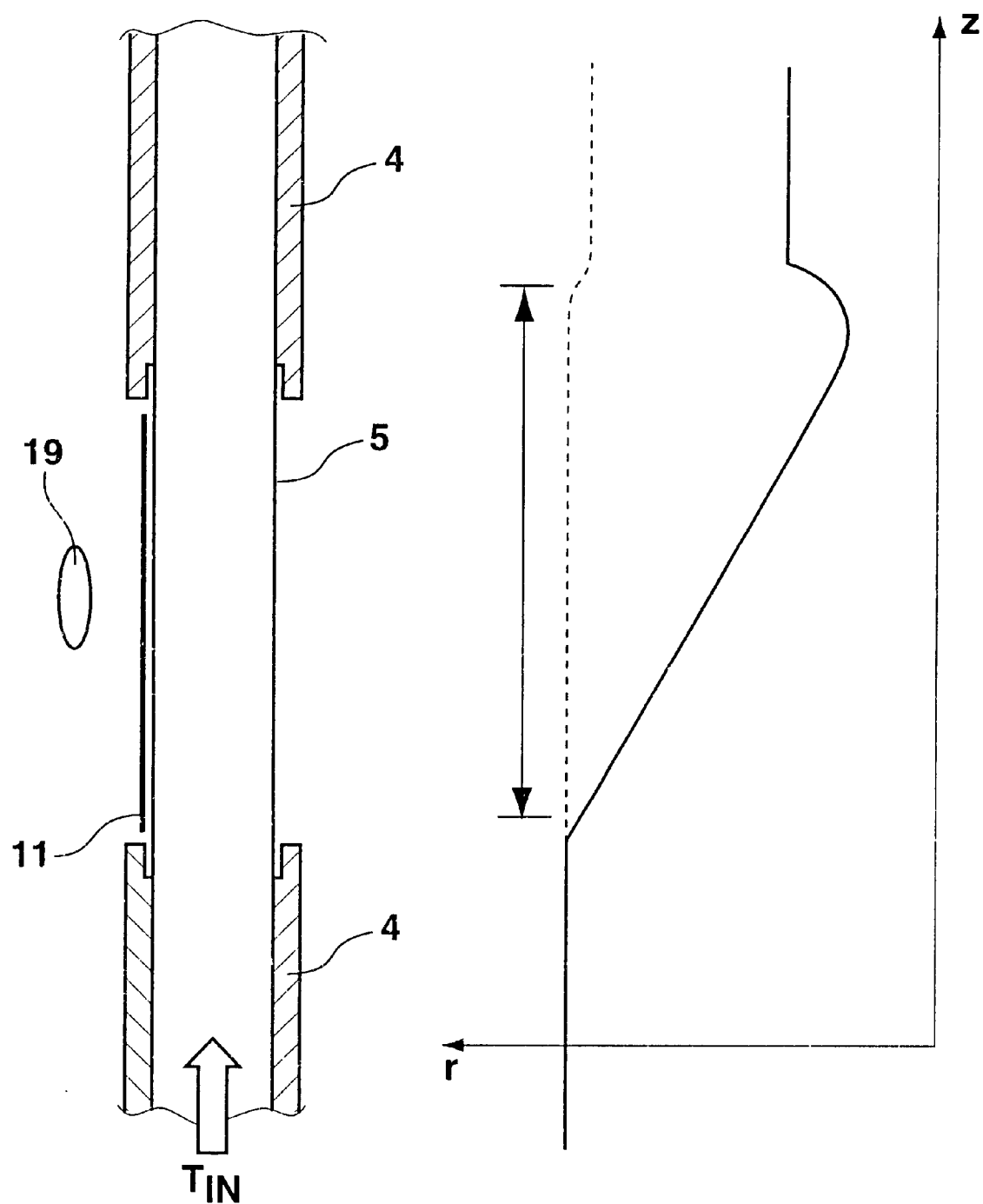
FIG. 12 shows a schematic vertical section through an inventive arrangement having a tempering means, and the associated temperature dependence along the z axis.

FIG. 12 finally shows a schematic vertical section through an NMR probe head in accordance with the invention having a tempering means 11 in the axial region of the inner pipe 5 of a room temperature pipe 4 and the associated temperature dependence along the z axis. The tempering means 11 can be effected e.g. through electric heating and/or radiation heating of a corresponding surface on the room temperature pipe 4 in the region of the inner pipe 5 using a heating means 19. The temperature dependence along the z axis shown on the right-hand side of the illustration, shows (full lines) the situation without tempering means and (broken lines) the situation with regulated tempering means where one can observe a nearly constant temperature along the entire z axis.

I claim:

1. An NMR (nuclear magnetic resonance) probe head for examining a sample substance in a sample tube, the probe head comprising:
   an RF receiver coil system;
   means for cooling said receiver coil system to cryogenic temperatures;
   a room temperature pipe extending along a z-direction, said room temperature pipe for receiving the sample tube; and
   at least one radiation shield disposed between said receiver coil system and said room temperature pipe, said at least one shield extending in the z-direction and surrounding said room temperature pipe in a radial direction, said radiation shield comprising at least one material oriented in the z-direction, wherein said at least one material is substantially transparent to RF fields.

2. The NMR probe head of claim 1 wherein N radiation shields are disposed in radial sequence between said receiver coil system and said room temperature pipe, wherein $N \geq 2$.

3. The NMR probe head of claim 2, wherein said N radiation shields are spaced apart from one another in a radial direction, said N radiation shields being one of out of contact, in point contact, and in linear contact with another.

4. The NMR probe head of claim 1, wherein said radiation shield has a radial thickness which is <0.1mm.

5. The NMR probe head of claim 1, wherein said radiation shield comprises a material which absorbs or reflects radiation in a wavelength range of 10 $\mu$m $\leq \lambda \leq$ 100 $\mu$m and which is substantially transparent to radiation in a wavelength range of λ>100 mm.

6. The NMR probe head of claim 5, wherein said radiation shield comprises glass or quartz.

7. The NMR probe head of claim 1, wherein said radiation shield comprises a unidirectional foil.

8. The NMR probe head of claim 1, wherein said radiation shield comprises a unidirectional fabric.

9. The NMR probe head of claim 8, wherein said fabric comprises at least one of fiber mats and fiber glass mats.

10. The NMR probe head of claim 1, wherein said radiation shield comprises at least one of rods, fibers, glass fibers, and quartz fibers, oriented in the z-direction and disposed radially about an axis of said room temperature pipe.

11. The NMR probe head of claim 10, wherein said radiation shield comprises fiber bundles.

12. The NMR probe head of claim 10, wherein said rods or fibers are freely disposed in space and are attached only at ends thereof.

13. The NMR probe head of claim 10, further comprising a support pipe disposed coaxially with respect to said room temperature pipe to which said rods or fibers are mounted.

14. The NMR probe head of claim 10, wherein said rods or fibers are mounted to a side of said room temperature pipe facing said receiver coil system.

15. The NMR probe head of claim 10, wherein said rods or fibers are mounted to one of a support pipe and said room temperature pipe using a glue transparent to RF radiation.

16. The NMR probe head of claim 10, wherein said rods or fibers are densely packed in a peripheral direction about an axis of said room temperature pipe.

17. The NMR probe head of claim 1, further comprising a centering device for centering the sample tube in its measuring position about an axis of said room temperature pipe.

18. The NMR probe head of claim 17, wherein said centering device comprises at least one spacer which is disposed between said room temperature pipe and the sample tube and distributed symmetrically about a z-axis of said room temperature pipe.

19. The NMR probe head of claim 18, wherein said at least one spacer is disposed in one of an area of a bottom of the sample tube in its measuring position and in a region of a feed opening of said room temperature pipe at a side of said room temperature pipe facing the sample tube.

20. The NMR probe head of claim 18, wherein said spacer is disposed along an entire axial length of said receiver coil system at a side of said room temperature pipe facing the sample tube.

21. The NMR probe head of claim 18, wherein said spacer comprises strips of flexible material extending in a direction of the z-axis, whose ends, facing away from the sample tube in its measuring position, are rigidly connected to said room temperature pipe, and whose ends, facing the sample tube in its measuring position, have a bead that bulges towards the sample tube, said bead having a free leg seating on said room temperature pipe.

22. The NMR probe head of claim 18, wherein said spacer comprises at least one of a material which is transparent to RF radiation and a magnetically compensated material.

23. The NMR probe head of claim 18, wherein said spacer comprises sheet metal strips having a thickness of approximately 100μm and a width transverse to a z axis of approximately 0.5 mm to 2mm.

24. The NMR probe head of claim 1, further comprising a tempering means disposed between said receiver coil system and the sample, said tempering means extending in a direction and surrounding the sample tube in a radial direction, said tempering means comprising material which is substantially transparent to RF fields.

25. The NMR probe head of claim 24, wherein said tempering means comprises a layer radially surrounding the sample tube in an axial region of said receiver coil system, said layer having a radial thickness which is <1 mm and which is made from a material which at least partially absorbs radiation in a wavelength range of 100nm≦λ≦100μm and which is transparent to radiation in a wavelength range of λ>100mm.

26. The NMR probe head of claim 25, further comprising a heating means for uniform heating of said layer.

27. The NMR probe head of claim 26, wherein said heating means comprises a device for irradiating said layer with one of radiation in a wavelength range of 100 nm≦λ≦100 μm and heat radiation.

28. The NMR probe head of claim 27, wherein said irradiating device is disposed on a side of said room temperature pipe facing said receiver coil system.

29. The NMR probe head of claim 25, wherein said layer surrounds a surface of said room temperature pipe.

30. The NMR probe head of claim 25, wherein said layer is disposed about said room temperature pipe in axially extending strips which are separated from one another in a peripheral direction.

31. NMR probe head of claim 25, wherein said layer can be electrically heated.

32. The NMR probe head of claim 24, wherein said tempering means comprises at least one heating coil of thin material having good electric conductance, wherein each of said at least one heating coil comprises an outgoing and return conductor, wherein said outgoing and return conductors are electrically connected to one another at one end and can be supplied with heating current from a current source at an other end.

33. The NMR probe head of claim 32, wherein said outgoing and return conductors are disposed bifilarly in close mutual adjacency.

34. The NMR probe head of claim 33, wherein said outgoing and return conductors comprise two longitudinal strips disposed one on top of an other, which are electrically insulated from one another via an insulation layer or insulation strip.

35. The NMR probe head of claim 32, wherein said outgoing and return conductors comprise materials having different magnetic susceptibilities which are selected such that said heating coil is magnetically compensated towards an outside.

36. The NMR probe head of claim 32, wherein said at least one heating coil is disposed in a spiral fashion about said room temperature pipe.

37. The NMR probe head of claim 32, wherein one of several and at least 8 heating coils are disposed at a separation from one another in a peripheral direction about a z axis of said room temperature pipe and extending parallel to the z-direction.

38. The NMR probe head of claim 32, wherein said heating coil is spatially oriented for minimal coupling to said receiver coil system.

39. The NMR probe head of claim 32, wherein said heating coil comprise a thin material exhibiting good electrical conductance and having a cross-section between 1 $\mu m^2$ and 100 $\mu m^2$.

40. The NMR probe head of claim 32, further comprising a low-pass filter circuited between said current source and said heating coil.

41. The NMR probe head of claim 32, further comprising a parallel resonant circuit disposed between said current source and said heating coil, said resonant circuit resonating at a frequency most sensitive for NMR measurements.

42. The NMR probe head of claim 32, wherein said current source generates alternating current.

43. The NMR probe head of claim 1, wherein said at least one material is absorbing of RF fields by <5 %.

44. The NMR probe head of claim 43, wherein said at least one material is absorbing of RF fields by <1 %.

45. The NMR probe head of claim 2, wherein $5 \leq N < 25$.

46. The NMR probe head of claim 4, wherein said radiation shield has a radial thickness which is <50 μm.

47. The NMR probe head of claim 23, wherein said sheet metal strips have said width transverse to said z axis of approximately 1 mm.

48. The NMR probe head of claim 24, wherein said material of said tempering means is high in thermal conductivity.

49. The NMR probe head of claim 24, wherein said material of said tempering means is absorbing of RF fields by <5 %.

50. The NMR probe head of claim 49, wherein said material of said tempering means is absorbing of RF fields by <1 %.

51. The NMR probe head of claim 25, wherein said layer has a radial thickness <50 μm.

* * * * *